US012581903B2

(12) United States Patent
Ueno et al.

(10) Patent No.: US 12,581,903 B2
(45) Date of Patent: Mar. 17, 2026

(54) CENTERING DEVICE, CENTERING METHOD, AND SUBSTRATE PROCESSING APPARATUS

(71) Applicant: SCREEN HOLDINGS CO., LTD., Kyoto (JP)

(72) Inventors: Hiroyuki Ueno, Kyoto (JP); Itsuki Kajino, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 277 days.

(21) Appl. No.: 18/157,970

(22) Filed: Jan. 23, 2023

(65) Prior Publication Data

US 2023/0253231 A1      Aug. 10, 2023

(30) Foreign Application Priority Data

Feb. 7, 2022     (JP) ................................. 2022-017003

(51) Int. Cl.
*H01L 21/68* (2006.01)
*H01L 21/67* (2006.01)
*H01L 21/683* (2006.01)

(52) U.S. Cl.
CPC .......... *H01L 21/68* (2013.01); *H01L 21/6708* (2013.01); *H01L 21/67259* (2013.01); *H01L 21/6838* (2013.01)

(58) Field of Classification Search
None
See application file for complete search history.

(56) References Cited

U.S. PATENT DOCUMENTS 5,851,102 A      12/1998   Okawa et al.
2006/0086462 A1*   4/2006   Inada ...................... H01L 21/68
                                                257/E21.252
(Continued)

FOREIGN PATENT DOCUMENTS

CN        208093534 U      11/2018
CN        211088237 U       7/2020
(Continued)

OTHER PUBLICATIONS

Office Action dated on May 28, 2024 issued in the corresponding Korean Patent Application No. 10-2022-0157255, w/ English Translation.
(Continued)

*Primary Examiner* — Sylvia Macarthur
(74) *Attorney, Agent, or Firm* — Rimon P.C.

(57) ABSTRACT
According to the present invention, a substrate is surrounded in a horizontal plane on an upper surface of a substrate support by a first abutting member located at a first reference position, a second abutting member located at a second reference position, and a third abutting member located at a third reference position. The three abutting members make tiny movements repeatedly to get closer to the substrate gradually while distances from the center of the substrate support are kept equally. While the abutting members make the movements of getting closer to the substrate, the abutting members abut on the substrate successively to move the substrate horizontally toward the center of the substrate support. As a result, at a time when the substrate is nipped with the three abutting members, the center of the substrate is aligned with the center of the substrate support to complete a centering operation.

12 Claims, 6 Drawing Sheets

(56) References Cited

U.S. PATENT DOCUMENTS

| | | | |
|---|---|---|---|
| 2009/0016857 A1 | 1/2009 | Nakamura | |
| 2011/0281376 A1 | 11/2011 | Amano | |
| 2011/0282484 A1 | 11/2011 | Amano | |
| 2015/0202774 A1 | 7/2015 | Blank et al. | |
| 2016/0023861 A1 | 1/2016 | Ito et al. | |
| 2016/0211164 A1 | 7/2016 | Glantschnig et al. | |
| 2018/0350632 A1* | 12/2018 | Kikumoto | H01L 21/681 |
| 2023/0253231 A1* | 8/2023 | Ueno | H01L 21/67259 |
| | | | 156/345.23 |

FOREIGN PATENT DOCUMENTS

| | | | | |
|---|---|---|---|---|
| CN | 113035764 A | | 6/2021 | |
| JP | H10-089904 A | | 4/1998 | |
| JP | 2000164681 A | * | 6/2000 | |
| JP | 2003-324141 A | | 11/2003 | |
| JP | 2006032661 A | * | 2/2006 | |
| JP | 2007-227823 A | | 9/2007 | |
| JP | 2008-060278 A | | 3/2008 | |
| JP | 2009-054269 A | | 3/2009 | |
| JP | 2011-181849 A | | 9/2011 | |
| JP | 2011-258924 A | | 12/2011 | |
| JP | 2011-258925 A | | 12/2011 | |
| JP | 2015-224300 A | | 12/2015 | |
| JP | 2017-183605 A | | 10/2017 | |
| JP | 2018-206877 A | | 12/2018 | |
| JP | 2019-149423 A | | 9/2019 | |
| KR | 10-2015-0088207 A | | 7/2015 | |
| TW | 201943009 A | | 11/2019 | |
| WO | 2007/088927 A1 | | 8/2007 | |

OTHER PUBLICATIONS

Taiwanese Office Action issued in corresponding Taiwanese Patent Application No. 111141217, dated Jul. 25, 2023.

Notice of Reasons for Refusal received in the corresponding Japanese Patent Application No. 2022-017003, dated Sep. 9, 2025.

* cited by examiner

F I G .  2
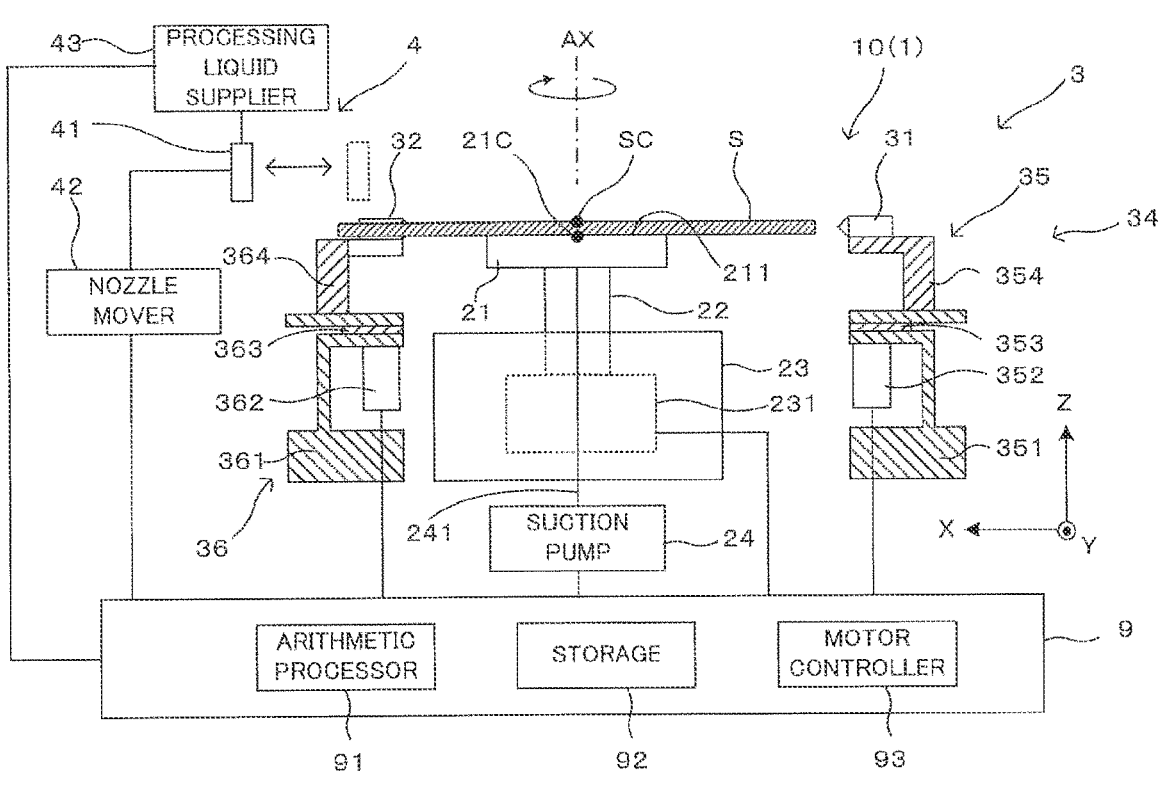
F I G .  3
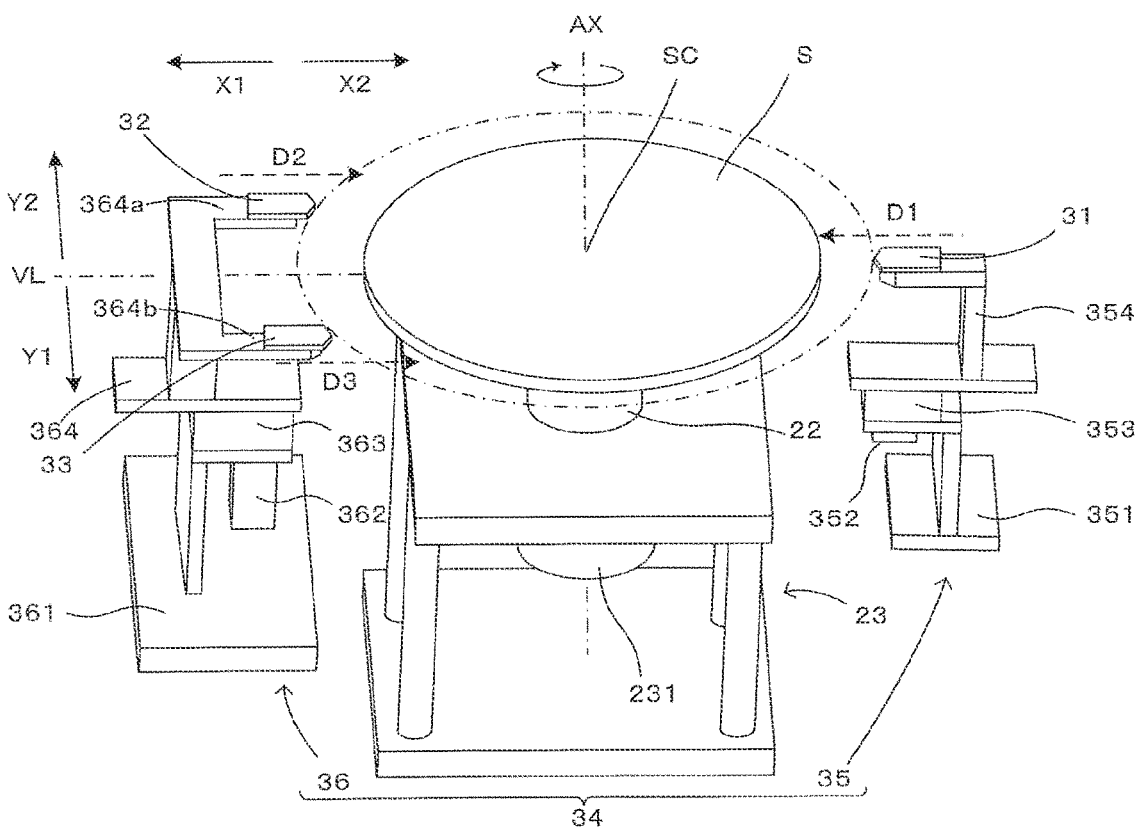

F I G.  4
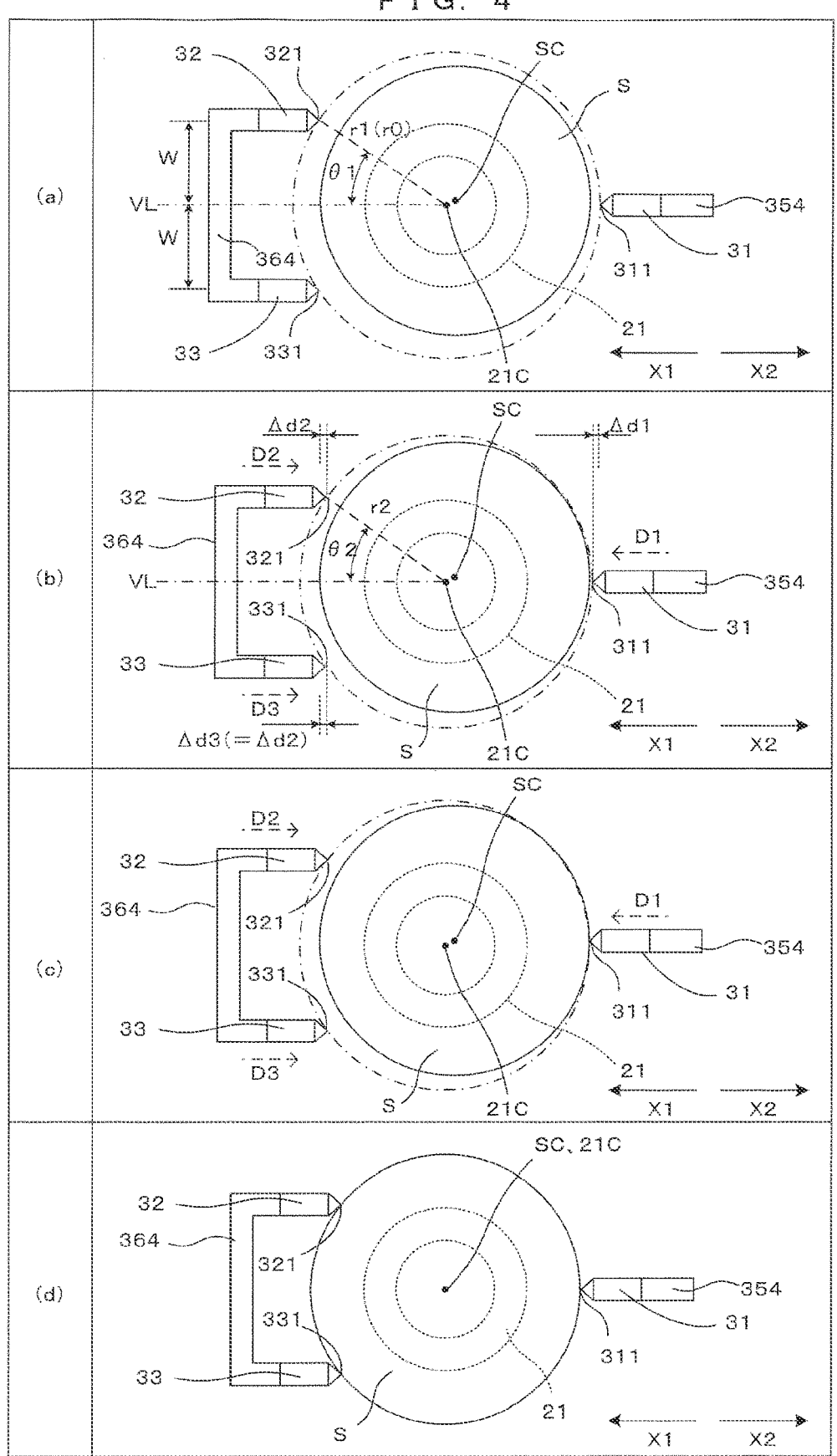

F I G.  5
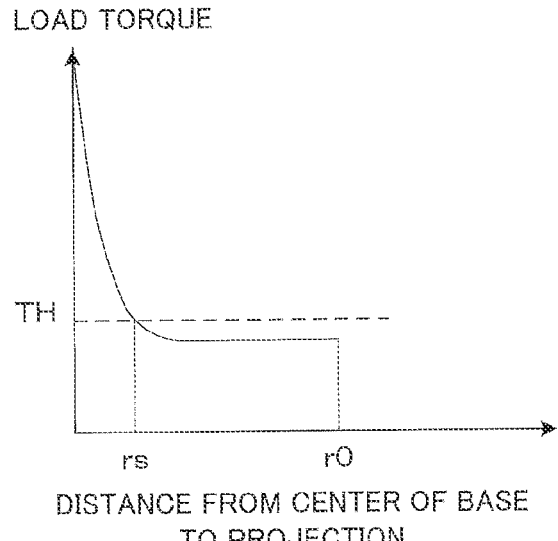
LOAD TORQUE
TH
rs                    rO
DISTANCE FROM CENTER OF BASE
TO PROJECTION
F I G.  6
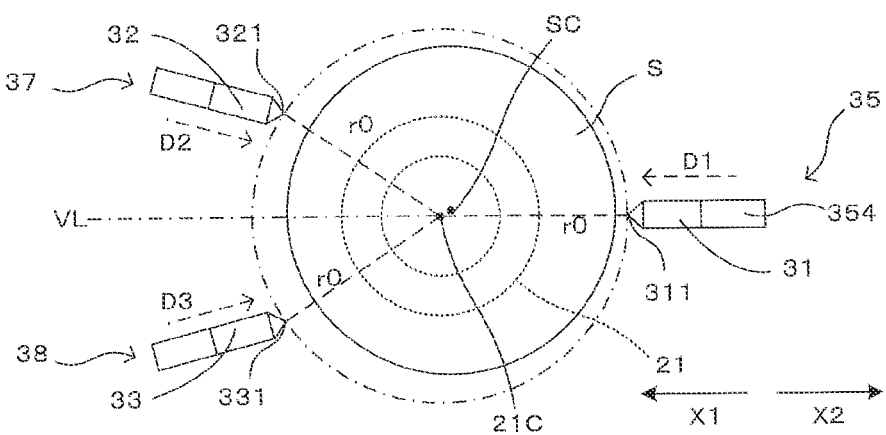

F I G. 7
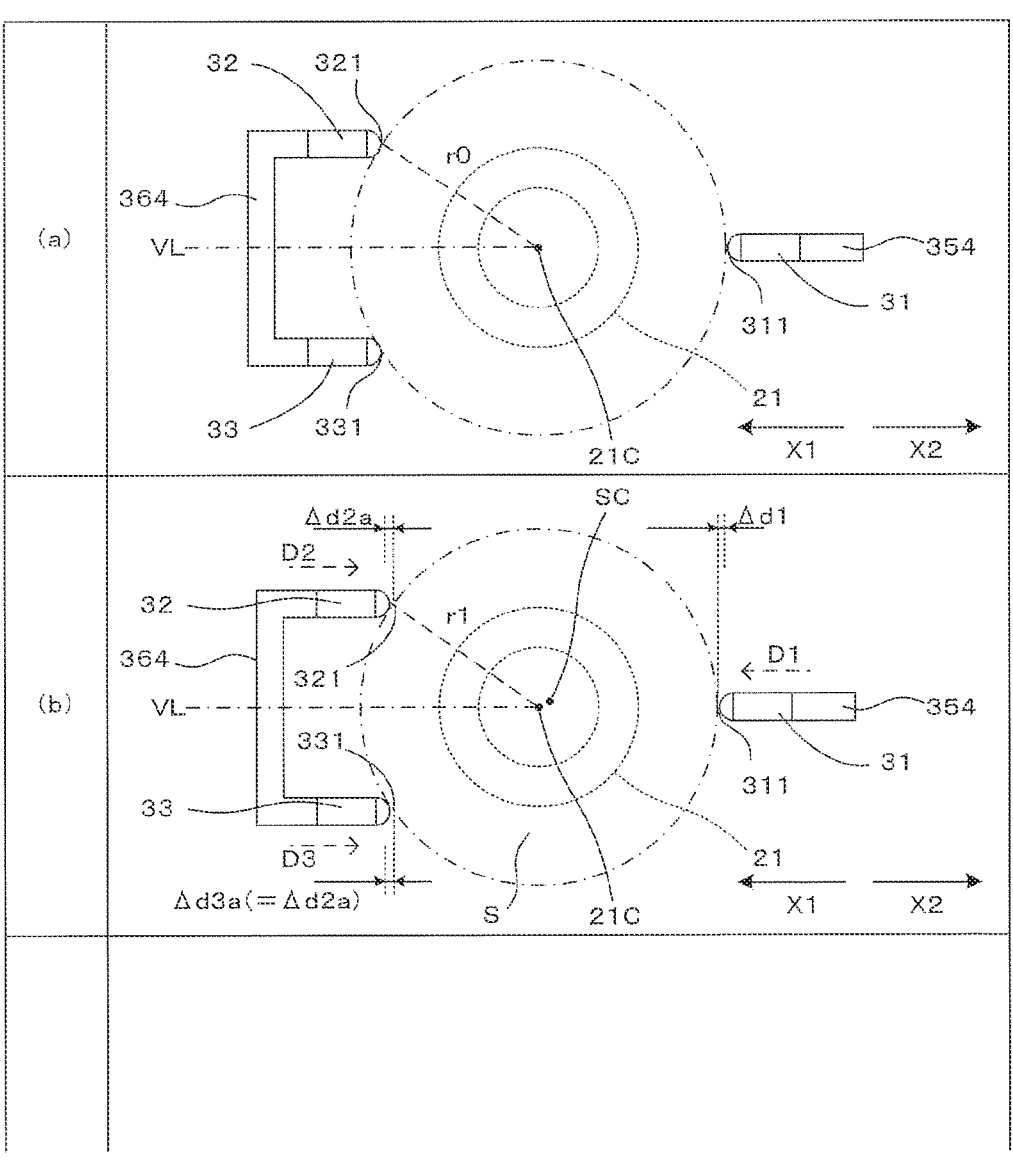

F I G. 8
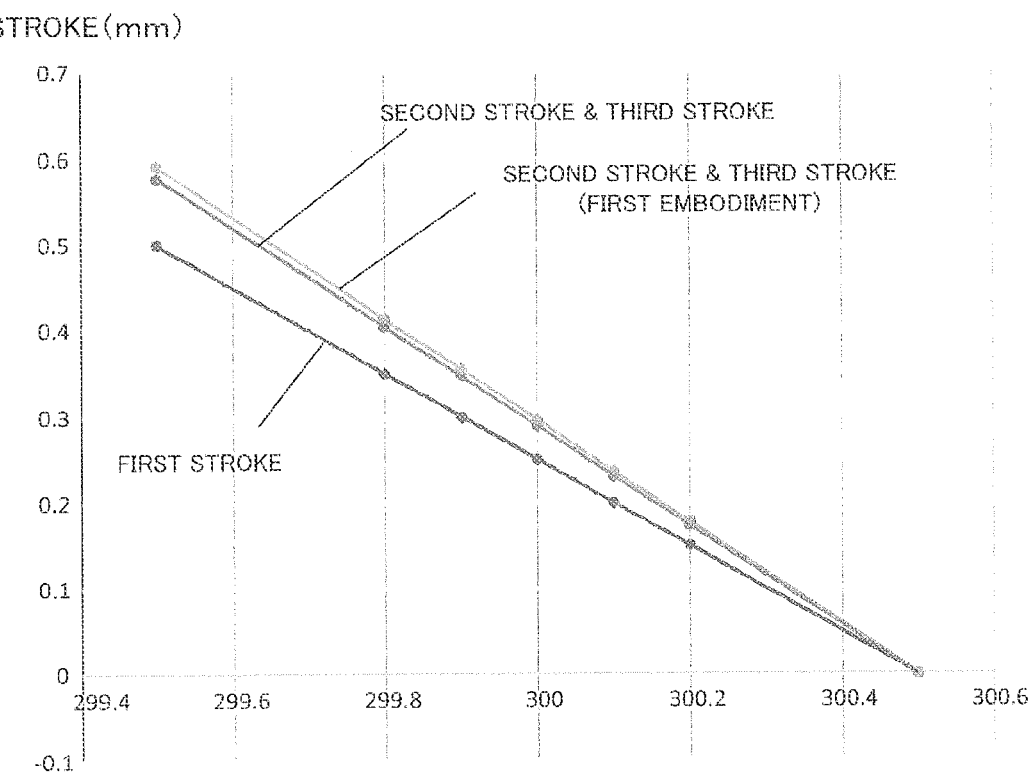

CENTERING DEVICE, CENTERING METHOD, AND SUBSTRATE PROCESSING APPARATUS

CROSS REFERENCE TO RELATED APPLICATION

The disclosure of Japanese Patent Application No. 2022-17003 filed on Feb. 7, 2022 including specification, drawings and claims is incorporated herein by reference in its entirety.

BACKGROUND OF THE INVENTION

1. Field of the Invention

The present invention relates to a centering technique of aligning the center of a substrate of a circular plate shape placed on an upper surface of a substrate support with the center of the substrate support, and a substrate processing apparatus that processes the substrate using the centering technique. This process includes a bevel etching process.

2. Description of the Related Art

In a known substrate processing apparatus, a chemical liquid process or a cleaning process is performed by supplying a processing liquid to a peripheral edge part of a substrate such as a semiconductor wafer while rotating the substrate. In an apparatus described in Japanese Patent Application Laid-Open No. 2019-149423, for example, a substrate is held under suction while being supported from below by a spin chuck (corresponding to an example of a "substrate support" of the present invention). In this case, misalignment between the center of the spin chuck and the center of the substrate decreases processing quality. In response to this, the above-described apparatus performs what is called a centering operation of reducing the amount of decentering of the substrate from the spin chuck before implementation of the process on the substrate.

SUMMARY OF INVENTION

The above-described conventional apparatus performs the centering operation in two stages. First, the amount of decentering i.e. eccentricity of the substrate from the spin chuck is measured. Next, the substrate on the spin chuck is pushed horizontally with a pusher to move the center of the substrate toward the center (rotary axis) of the spin chuck. Hence, room for improvement is left in terms of throughput.

The present invention has been made in view of the above-described problem, and is intended to provide a centering technique allowing the center of a substrate of a circular plate shape placed on an upper surface of a substrate support to be aligned with the center of the substrate support with excellent throughput, and a substrate processing apparatus using the centering technique.

A first aspect of the invention is a centering device that positions a substrate having a circular plate shape placed on an upper surface of a substrate support by moving the substrate horizontally on the upper surface of the substrate support in such a manner as to align the center of the substrate with the center of the substrate support, comprising: a first abutting member movable in a horizontal plane in a first horizontal direction from a first reference position toward the center of the substrate support, the first reference position being separated from the center of the substrate support by a reference distance longer than the radius of the substrate; a second abutting member movable in the horizontal plane in a second horizontal direction of causing the second abutting member to get closer to the substrate that is different from a direction from a second reference position toward the center of the substrate support, the second reference position being on the opposite side of the first abutting member with respect to the center of the substrate support, deviating from a virtual line extending in the first horizontal direction from the center of the substrate support, and separated from the center of the substrate support by the reference distance; a third abutting member movable in the horizontal plane in a third horizontal direction of causing the third abutting member to get closer to the substrate that is different from a direction from a third reference position toward the center of the substrate support, the third reference position being on the opposite side of the first abutting member with respect to the center of the substrate support, on the opposite side of the second abutting member with respect to the virtual line, and separated from the center of the substrate support by the reference distance; a moving mechanism configured to move the first abutting member, the second abutting member, and the third abutting member in the first horizontal direction, the second horizontal direction, and the third horizontal direction respectively; and a controller configured to control the moving mechanism, wherein the controller repeats tiny movements of moving the first abutting member, the second abutting member, and the third abutting member by a first stroke, a second stroke, and a third stroke respectively in such a manner that distances of the first abutting member, the second abutting member, and the third abutting member from the center of the substrate support are kept equally, and the controller stops the tiny movements when the controller determines that the substrate is nipped with the first abutting member, the second abutting member, and the third abutting member.

A second aspect of the invention is a centering method of aligning the center of a substrate having a circular plate shape with the center of a substrate support, comprising: placing the substrate on an upper surface of the substrate support while a first abutting member is located at a first reference position in a horizontal plane, a second abutting member is located at a second reference position in the horizontal plane, and a third abutting member is located at a third reference position in the horizontal plane, the first reference position being separated from the center of the substrate support by a reference distance longer than the radius of the substrate, the second reference position being on the opposite side of the first abutting member with respect to the center of the substrate support, deviating from a virtual line extending from the first reference position and passing through the center of the substrate support, and separated from the center of the substrate support by the reference distance, the third reference position being on the opposite side of the first abutting member with respect to the center of the substrate support, on the opposite side of the second abutting member with respect to the virtual line, and separated from the center of the substrate support by the reference distance; repeating tiny movements of moving the first abutting member in a first horizontal direction from the first reference position toward the center of the substrate support, moving the second abutting member by a second stroke in a second horizontal direction of causing the second abutting member to get closer to the substrate that is different from a direction from the second reference position toward the center of the substrate support, and moving the third abutting member by a third stroke in a third horizontal direction of causing the third abutting member to get closer to the substrate that is different from a direction from the third reference position toward the center of the substrate support in such a manner that distances of the first abutting member, the second abutting member, and the third abutting member from the center of the substrate support are kept equally while the substrate is kept placed horizontally movably on the upper surface of the substrate support; and stopping the tiny movements when the substrate is positioned so as to be nipped with the first abutting member, the second abutting member, and the third abutting member while the tiny movements are repeated.

A third aspect of the invention is a substrate processing apparatus comprising: a substrate support having an upper surface on which a substrate is supported in a horizontal posture; the above centering device; a suction unit configured to exhaust air from between the substrate positioned by the centering device and the substrate support so as to hold the substrate under suction on the substrate support; a rotary driver configured to rotate the substrate support about the center of the substrate support while the substrate is held under suction on the substrate support; and a processing liquid supply mechanism that supplies a processing liquid to a peripheral part of the substrate while the substrate is rotated about the center of the substrate support integrally with the substrate support.

According to the invention having the above-described configuration, the substrate is surrounded in the horizontal plane by the first abutting member located at the first reference position, the second abutting member located at the second reference position, and the third abutting member located at the third reference position. The three abutting members make tiny movements repeatedly to get closer to the substrate gradually while distances from the center of the substrate support are kept equally. While the abutting members make the movements of getting closer to the substrate, the abutting members abut on the substrate successively to move the substrate horizontally toward the center of the substrate support. As a result, the center of the substrate nipped with the three abutting members is aligned with the center of the substrate support.

As described above, according to the present invention, it is possible to align the center of the substrate of a circular plate shape placed on the upper surface of the substrate support with the center of the substrate support only through the tiny movements of the abutting members made repeatedly to achieve implementation of a centering operation on the substrate with excellent throughput.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

FIG. 2 briefly shows a configuration in one embodiment of the substrate processing apparatus.

FIG. 3 is a perspective view showing the configurations of a substrate holder and a centering mechanism of the substrate processing apparatus.

FIG. 4 schematically shows operation of the centering mechanism.

FIG. 5 is a graph showing variation in load torque with respect to variation in distance from the center of the base to the projection in the first embodiment.

FIG. 6 is a drawing schematically showing a configuration in a second embodiment of the centering device according to the present invention.

FIG. 7 is a drawing schematically showing a configuration in a third embodiment of the centering device according to the present invention.

FIG. 8 is a graph showing how a stroke is changed in response to change in a distance from the base center to the projection according to the third embodiment.

DETAILED DESCRIPTION OF THE PREFERRED EMBODIMENTS

Figure 1:
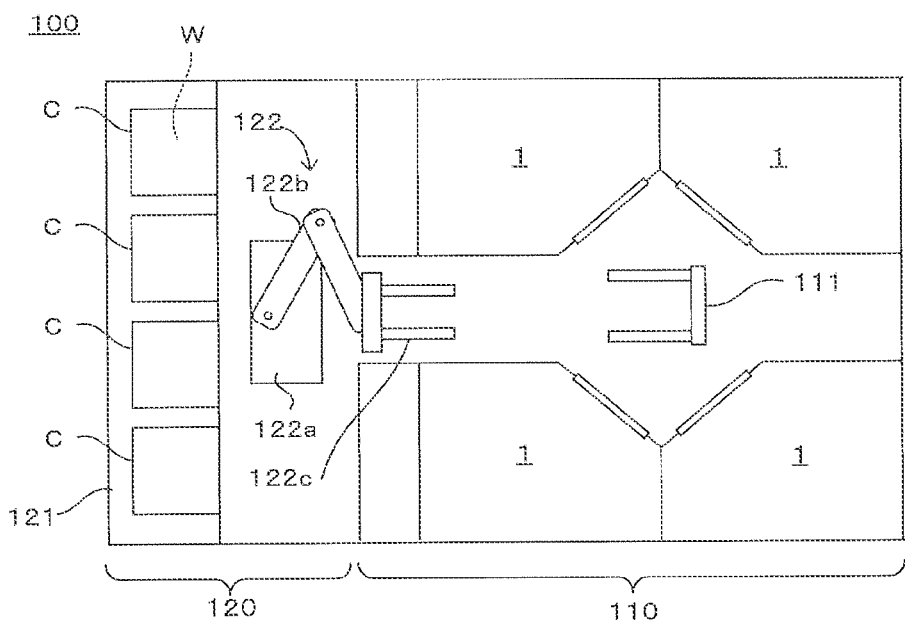
FIG. 1 is a drawing showing a substrate processing system equipped with an embodiment of a substrate processing apparatus according to the invention.

FIG. 1 is a drawing showing a substrate processing system equipped with an embodiment of a substrate processing apparatus according to the invention. The substrate processing apparatus 100 includes a substrate processing station 110 for processing the substrate S and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate S from the container C by accessing the container C held by the container holder 121 and housing a processed substrate S in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate S can be placed and held on the upper surface thereof. Such an indexer robot including the articulated arm and the hand for holding the substrate is not described in detail since being known.

The substrate processing station 110 includes a substrate conveyor robot 111 arranged substantially in a center in a plan view and a plurality of processing units 1 arranged to surround this substrate conveyor robot 11. Specifically, the plurality of (eight in this example) processing units 1 are arranged to face a space where the substrate conveyor robot 111 is arranged. The substrate conveyor robot 111 randomly accesses these processing units 1 and transfers the substrates W. On the other hand, each processing unit 1 performs a predetermined processing to the substrate S. In this embodiment, these processing units 1 have the same function. Thus, a plurality of the substrates W can be processed in parallel. In the embodiment, one of the processing units 1 corresponds to the substrate processing apparatus 10 according to the invention.

FIG. 2 briefly shows a configuration in one embodiment of the substrate processing apparatus. FIG. 3 is a perspective view showing the configurations of a substrate holder and a centering mechanism of the substrate processing apparatus. FIG. 4 schematically shows operation of the centering mechanism. The substrate processing apparatus 10 is an apparatus that performs a bevel etching process as an example of a "process" of the present invention, and supplies a processing liquid to a peripheral edge part of an upper surface of the substrate S in a processing chamber. For this purpose, the substrate processing apparatus 10 includes a substrate holder 2, a centering mechanism 3 forming a principal structure of a centering device according to the present invention, and a processing liquid supply mechanism 4. Operations of these structures are controlled by a control unit 9 responsible for control over the apparatus entirely.

The substrate holder 2 includes a spin base 21 that is a member of a smaller circular plate shape than the substrate S. The spin base 21 is supported on a rotary support shaft 22 extending downward from a central part of a lower surface of the spin base 21 in such a manner as to locate an upper surface 211 of the spin base 21 horizontally. The rotary support shaft 22 is rotatably supported by a rotary driver 23. The rotary driver 23 includes a built-in rotary motor 231. The rotary motor 231 rotates in response to a control command from the control unit 9. In response to receipt of resultant rotary driving force, the spin base 21 rotates about a vertical axis AX (alternate long and short dashed lines) extending in a vertical direction while passing through a center 21C of the spin base 21. In FIG. 2, a top-bottom direction corresponds to the vertical direction. A plane perpendicular to the plane of paper of FIG. 2 is a horizontal plane. To clearly show a relationship in terms of direction, a coordinate system defining a Z axis as the vertical direction and an XY plane as the horizontal plane is given in FIG. 2 and its subsequent drawings, if appropriate.

The upper surface 211 of the spin base 21 has a dimension by which the substrate S is supportable to allow the substrate S to be placed on the upper surface 211 of the spin base 21. Although not shown in the drawings, the upper surface 211 is provided with a plurality of suction holes or suction grooves, for example. Such suction holes or grooves are connected to a suction pump 24 through a suction pipe 241. In response to a control command from the control unit 9, the suction pump 24 operates to apply suction power from the suction pump 24 to the spin base 21. As a result, air is exhausted from between the upper surface 211 of the spin base 21 and a lower surface of the substrate S, thereby holding the substrate S under suction on the spin base 21. Together with the rotation of the spin base 21, the substrate S held under suction in this way rotates about the vertical axis AX. Hence, the occurrence of misalignment between a center SC of the substrate S and the center 21C of the spin base 21, namely, decentering of the substrate S reduces the quality of the bevel etching process.

In response to this, the centering mechanism 3 is provided in the present embodiment. The centering mechanism 3 performs a centering operation while suction using the suction pump 24 is stopped (namely, while the substrate S is horizontally movable on the upper surface 211 of the spin base 21). As a result of implementation of the centering operation, the above-described decentering is eliminated to make alignment between the center SC of the substrate S and the center 21C of the spin base 21. The configuration and operation of the centering mechanism 3 will be described later in detail.

The processing liquid supply mechanism 4 is provided to perform the bevel etching process on the substrate S after implementation of the centering operation on the substrate S. The processing liquid supply mechanism 4 includes a processing liquid nozzle 41, a nozzle mover 42 that moves the processing liquid nozzle 41, and a processing liquid supplier 43 that supplies a processing liquid to the processing liquid nozzle 41. The nozzle mover 42 moves the processing liquid nozzle 41 between a retreat position to which the processing liquid nozzle 41 retreats laterally from a position above the substrate S as indicated by solid lines in FIG. 2 and a processing position above a peripheral edge part of the substrate S as indicated by dotted lines in FIG. 2.

The processing liquid nozzle 41 is connected to the processing liquid supplier 43. When a suitable processing liquid is supplied from the processing liquid supplier 43 to the processing liquid nozzle 41 located at the processing position, the processing liquid is ejected from the processing liquid nozzle 41 onto a peripheral edge part of the rotating substrate S. By doing so, the bevel etching process with the processing liquid is performed on the entire peripheral edge part of the substrate S.

Although not shown in FIG. 2, a splash guard is provided in such a manner as to surround the substrate holder 2 from the side. The splash guard collects droplets of a processing liquid blown off from the substrate S during implementation of the bevel etching process to effectively prevent the collected droplets from flying around the apparatus.

The configuration of the centering mechanism 3 will be described next by referring to FIGS. 2 to 4. The centering mechanism 3 has the function of determining the position of the substrate S by moving the substrate S horizontally on the upper surface 211 of the spin base 21 in such a manner as to align the center SC of the substrate S placed on the upper surface 211 of the spin base 21 with the center 21C of the spin base 21. As shown in FIG. 3, as viewed in the X direction, the centering mechanism 3 includes an abutting member 31 arranged closer to an X2 direction (right-hand direction in FIG. 3) and an abutting member 32 and an abutting member 33 arranged closer to an X1 direction (left-hand direction in FIG. 3) with respect to the center 21C of the spin base 21. The centering mechanism 3 further includes a moving mechanism 34 for moving the abutting members 31 to 33 in a horizontal direction.

The moving mechanism 34 includes a single mover 35 for moving the abutting member 31, and a multi-mover 36 for moving the abutting members 32 and 33 collectively. The single mover 35 is arranged closer to the X2 direction and the multi-mover 36 is arranged closer to the X1 direction with respect to the center 21C of the spin base 21.

The single mover 35 includes a fixed base 351, a rotary motor 352, a power transmitter 353, and a slider 354. The rotary motor 352 is mounted on the fixed base 351, and the power transmitter 353 and the slider 354 are stacked in this order over the fixed base 351. The rotary motor 352 is a driving source for moving the abutting member 31 in the X direction. When the rotary motor 352 operates in response to a control command from the control unit 9, a rotary shaft (not shown in the drawings) rotates. This rotary shaft extends from the top of the fixed base 351 to the power transmitter 353 and rotary driving force generated by the rotary motor 352 is transmitted to the power transmitter 353. Using a rack-and-pinion structure, for example, the power transmitter 353 converts rotary motion responsive to the rotary driving force to liner motion in the X direction, and transmits the linear motion to the slider 354. This makes the slider 354 move back and forth in the X direction by a distance responsive to the amount of the rotation. As a result, in response to the movement of the slider 354, the abutting member 31 mounted on the top of the slider 354 is moved in the X direction.

The multi-mover 36 has a configuration basically the same as that of the single mover except that a slider 364 has a partially different structure. Specifically, the multi-mover 36 applies rotary driving force generated by a rotary motor 362 mounted on a fixed base 361 to the slider 364 using a power transmitter 363, thereby moving the slider 364 in the X direction. The slider 364 has a top including two arms 364a and 364b extending in the X2 direction and separated from each other in a Y direction. The top of the slider 364 has a substantially C-shape in a plan view from vertically above. The abutting members 32 and 33 are mounted on end portions closer to the X2 direction of the arms 364a and 364b respectively. Thus, when the rotary motor 362 operates in response to a control command from the control unit 9, the slider 364 moves back and forth in the X direction by a distance responsive to the amount of the rotation of the rotary motor 362, like in the single mover 35. As a result, in response to the movement of the slider 364, the abutting members 32 and 33 mounted on the slider 364 are moved in the X direction.

An end portion of each of the abutting members 31 to 33 facing the substrate S is formed into a projecting shape like a beak. Namely, the projection (tip) of each of the abutting members 31 to 33 is sharply pointed. This allows the abutting members 31 to 33 to make point contact with a side surface of the substrate S supported on the upper surface 211 of the spin base 21. When the abutting member 31 is moved in the X1 direction by the single mover 35, a projection 311 of the abutting member 31 goes toward the center 21C of the spin base 21 to abut on the side surface of the substrate S. As described above, in the present embodiment, a D1 direction in which the abutting member 31 moves for abutting on the substrate S is the X1 direction, and this direction corresponds to a "first horizontal direction" of the present invention. After making the abutting contact, the abutting member 31 moves further in the D1 direction, thereby moving the substrate S horizontally on the upper surface 211 of the spin base 21 in the X1 direction while pressing the substrate S in the X1 direction. In the present embodiment, to facilitate understanding of the substance of the invention, a virtual line VL extended in the X1 direction from the center 21C of the spin base 21 is additionally illustrated in FIGS. 3 and 4. This line corresponds to a "virtual line" of the present invention. The configuration of the centering mechanism 3 will be described continuously using the virtual line VL in appropriate cases.

A configuration in which the abutting members 32 and 33 are moved by the multi-mover 36 partially differs from that of the abutting member 31. The reason for this is that the abutting members 32 and 33 are arranged line-symmetrically to each other with respect to the virtual line VL in the horizontal plane and are moved in the X direction while being kept in this arrangement state. More specifically, as shown in a section (a) of FIG. 4, the abutting member 32 is arranged at a position deviating from the virtual line VL by a predetermined distance W (shorter than a radius rs of the substrate S) to be closer to a Y2 direction. Meanwhile, the abutting member 33 is arranged at a position deviating by the same distance W as the abutting member 32 from the virtual line VL to be closer to the opposite side of the abutting member 32 with respect to the virtual line VL, specifically, to be closer to a Y1 direction. Thus, when the abutting members 32 and 33 are moved in the X2 direction by the multi-mover 36, a projection 321 of the abutting member 32 abuts on the substrate side surface at a position closer to the Y2 direction than the virtual line VL. Furthermore, a projection 331 of the abutting member 33 abuts on the substrate side surface at a position closer to the Y1 direction than the virtual line VL. As described above, in the present embodiment, a D2 direction in which the abutting member 32 moves for abutting on the substrate S is the X2 direction, and this direction corresponds to a "second horizontal direction" of the present invention. A D3 direction in which the abutting member 33 moves for abutting on the substrate S is also the X2 direction, and this direction corresponds to a "third horizontal direction" of the present invention. Thus, in order to move the projections 311, 321, and 331 while distances from the center 21C of the spin base 21 to the projections 311, 321, and 331 are kept equally, a stroke per unit time is required to differ between the abutting member 31 and the abutting members 32, 33. This will be described in detail by referring to FIG. 4 and the centering operation using the above-described configuration of movement will also be described.

In order to place the substrate S on the upper surface 211 of the spin base 21, the projections 311, 321, and 331 are desirably located at their reference positions determined by giving consideration at least to a maximum of an outer diameter tolerance of the substrate S. If the substrate S has a diameter of 300 mm, for example, an outer diameter tolerance is 0.2 mm. For this reason, the projections 311, 321, and 331 are required to be separated by a distance of 150.1 mm or more from the center 21C of the spin base 21. In the present embodiment, this distance is called a "reference distance r0." As shown in the section (a) of FIG. 4, a circle (dash-dotted line) centered on the center 21C of the spin base 21 and having a radius corresponding to the reference distance r0 is called a reference circle.

In a case considered next, after the abutting members 31 to 33 are located at their positions determined in such a manner as to place the projections 311, 321, and 331 on the reference circle, the projections 311, 321, and 331 are moved toward the substrate S. In this case, the position of the abutting member 31 for placing the projection 311 on the reference circle corresponds to a "first reference position" of the present invention. Furthermore, the position of the abutting member 32 for placing the projection 321 on the reference circle corresponds to a "second reference position" of the present invention, and the position of the abutting member 33 for placing the projection 331 on the reference circle corresponds to a "third reference position" of the present invention.

In a case considered next, while the abutting members 31 to 33 are located at the first reference position, the second reference position, and the third reference position respectively, the abutting member 31 makes a tiny movement by a first stroke $\Delta d1$ in the D1 direction (X1 direction) toward the substrate S. If each of the abutting members 32 and 33 makes a tiny movement by the same distance in the D2 direction (X2 direction) in response to the movement of the abutting member 31, the projections 311, 321, and 331 are separated by nonuniform distances from the center 21C of the spin base 21. Hence, repeating the tiny movements of the abutting members 31 to 33 while keeping a uniform stroke per unit time results in the failure to align the center SC of the substrate S with the center 21C of the spin base 21.

In response to this, as shown in a section (b) of FIG. 4, a distance $\Delta d2$ by which the abutting member 32 makes the tiny movement (corresponding to a "second stroke" of the present invention) and a distance $\Delta d3$ by which the abutting member 33 makes the tiny movement (corresponding to a "third stroke" of the present invention) may be set as follows.

$$\Delta d2 = \Delta d3 = r1 \cdot \cos\ \theta1 - r2 \cdot \cos\ \theta2 = r1 \cdot \cos(\sin^{-1}(W/r1)) - r2 \cdot \cos(\sin^{-1}(W/r2))$$

$$r1 = r0$$

$$R2 = r1 - \Delta d1$$

In these formulas, r1: a distance from the center 21C to the projection 321 before making the tiny movement;

θ1: an angle formed between the line connecting the center 21C and the projection 321 and the virtual line VL before making the tiny movement;

r2: a distance from the center 21C to the projection 321 after making the tiny movement;

θ2: an angle formed between the line connecting the center 21C and the projection 321 and the virtual line VL after making the tiny movement; and W: a spacing from the virtual line VL to the abutting member 32.

In this case, even after making of the tiny movements, the projections 311, 321, and 331 are still at an equal distance from the center 21C of the spin base 21. By repeating these tiny movements, the abutting members 31 to 33 get closer to the substrate S while distances from the center 21C of the spin base 21 to the projections 311, 321, and 331 are kept equally. By doing so, on the occurrence of decentering such as that shown in FIG. 4, for example, the abutting member 31 first abuts on the substrate S while these tiny movements are repeated to move the substrate S in the D1 direction (see a section (c) of FIG. 4). Subsequent to this, the abutting member 32 abuts on the substrate S being pressed and moved by the abutting member 31 to move the substrate S horizontally. When distances from the center 21C of the spin base 21 to the projections 311, 321, and 331 thereafter become equal to the radius of the substrate S as shown in a section (d) of FIG. 4, the last abutting member 33 also abuts on the substrate S. By doing so, the substrate S is nipped with the abutting members 31 to 33 to stop the movement of the substrate S and the center SC of the substrate S is aligned with the center 21C of the spin base 21. In this way, the centering operation is feasible on the substrate S.

In the present embodiment including the centering mechanism 3, the control unit 9 controls each part of the substrate processing apparatus 10 to perform the centering operation described above and the subsequent bevel etching process. The control unit 9 includes an arithmetic processor 91 composed of a computer with a central processing unit (CPU), a random access memory (RAM), etc., a storage 92 such as a hard disk drive, and a motor controller 93.

The arithmetic processor 91 reads a centering program and a bevel etching program as appropriate stored in advance in the storage 92, develops the program in the RAM (not shown in the drawings), and performs the centering operation and the bevel etching process shown in FIG. 4. In particular, in performing the centering operation, the arithmetic processor 91 calculates the first stroke Δd1 to the third stroke Δd3, and controls the rotary motors 352 and 362 of the moving mechanism 34 through the motor controller 93 on the basis of the calculated strokes Δd1 to Δd3. Furthermore, the arithmetic processor 91 calculates a load torque at the single mover 35 on the basis of a motor current value applied to the rotary motor 352 and calculates a load torque at the multi-mover 36 on the basis of a motor current value applied to the rotary motor 362. In response to change in a distance from the center 21C of the spin base 21 to each of the projections 311, 321, and 331 (a distance from the base center to the projection) occurring while the tiny movements are repeated, the load torque varies in a manner shown in FIG. 5, for example. As shown in FIG. 5, at a time when this distance conforms to the radius rs of the substrate S, specifically, when the substrate S is nipped with the abutting members 31 to 33, the load torques increase steeply at the single mover 35 and the multi-mover 36 nearly simultaneously. At a time when the load torque exceeds a threshold, the arithmetic processor 91 determines that the centering operation is completed and stops the movements of the abutting members 31 to 33. In the present embodiment, variation in the load torque at each of the motors 352 and 362 is monitored. Alternatively, only one of the motors may be monitored to determine timing of stopping movements of the abutting members 31 to 33. Additionally, the load torque may certainly be calculated on the basis of an element other than the motor current value.

As described above, in the present embodiment, the abutting members 31 to 33 make the tiny movements repeatedly to get closer to the substrate S gradually while distances from the center 21C of the spin base 21 to the projections 311, 321, and 331 are kept equally. Then, the substrate S is nipped with the three abutting members 31 to 33 to align the center SC of the substrate S with the center 21C of the spin base 21. As described above, the centering operation is performed only through the tiny movements of the abutting members 31 to 33 made repeatedly. This achieves implementation of the centering operation with excellent throughput.

The completion of the centering operation is determined on the basis of variation in the load torque and the movements of the abutting members 31 to 33 are stopped immediately. This makes it possible to finish the centering operation at appropriate time without damaging the substrate S. This also applies to embodiments described later.

As described above, in the substrate processing apparatus 10, a combination of the centering mechanism 3 and the control unit 9 corresponds to the first embodiment of the centering device according to the present invention. Specifically, the abutting members 31 to 33 correspond to an example of a "first abutting member," an example of a "second abutting member," and an example of a "third abutting member" of the present invention respectively. The control unit 9 corresponds to an example of a "controller" of the present invention. The spin base 21 and the center 21C correspond to an example of a "substrate support" and an example of the "center of the substrate support" of the present invention respectively. The suction pump 24 corresponds to an example of a "suction unit" of the present invention.

In the first embodiment described above, the two abutting members 32 and 33 are moved in the D2 direction (X2 direction) and in the D3 direction (X2 direction) respectively by the multi-mover 36. However, the multi-mover 36 may be replaced with a single mover for the abutting member 32 and a single mover for the abutting member 33 each having the same configuration as the single mover 35. In this case, the single movers provided for the abutting members 31 to 33 correspond to an example of a "first single mover," an example of a "second single mover," and an example of a "third single mover" of the present invention respectively.

Like in this case, if the single mover for the abutting member 32 and the single mover for the abutting member 33 are provided, both the D2 direction and the D3 direction are not required to conform to the X2 direction but at least one of the D2 direction and the D3 direction may be changed from the X2 direction (second embodiment).

FIG. 6 schematically shows a configuration in a second embodiment of the centering device according to the present invention. The second embodiment largely differs from the first embodiment in that the multi-mover 36 is replaced with a single mover 37 for the abutting member 32 and a single mover 38 for the abutting member 33 each having the same configuration as the single mover 35, and that both the D2 direction and the D3 direction differ from the X2 direction. In the second embodiment, like the cases of the sections (a) and (b) of FIG. 4 and like the considerations given to the second stroke and the third stroke on the basis of these sections, the second stroke and the third stroke are set individually. The other configuration and the other operation are basically the same as those of the first embodiment.

Also in the second embodiment having the above-described configuration, the abutting members 31 to 33 successively abut on the substrate S so the substrate S is nipped with the abutting members 31 to 33 while distances from the center 21C of the spin base 21 to the projections 311, 321, and 331 are kept equally. By doing so, the center SC of the substrate S is aligned with the center 21C of the spin base 21. In this way, the centering operation is performed only through tiny movements of the abutting members 31 to 33 made repeatedly to achieve implementation of the centering operation with excellent throughput.

FIG. 7 schematically shows a configuration in a third embodiment of the centering device according to the present invention. The third embodiment largely differs from the first embodiment in the shape of each of the projections 311, 321, and 331 of the abutting members 31 to 33 respectively. Specifically, in the first embodiment, each of the projections 311, 321, and 331 has a sharply pointed shape. This causes relatively severe wear as a result of abutment on the substrate S to cause the risk of increased exchange frequency. In response to this, as shown in FIG. 7, each of the projections 311, 321, and 331 may be formed into a semi-circular disk shape. Furthermore, in the third embodiment, a position of abutting contact of the projection 321 with the substrate S is shifted in response to a stroke of the abutting member 32 in the D2 direction. This also applies to a position of abutting contact of the projection 331.

Hence, it is impossible to calculate the second stroke and the third stroke of the third embodiment by directly applying the sections (a) and (b) of FIG. 4 and the considerations given to the second stroke and the third stroke on the basis of these sections.

In response to this, in the third embodiment, the reference distance r0 is set at 150.25 mm (=300.5 mm/2) and the diameter of each of the projections 311, 321, and 331 is set at 20 mm. Then, plan views are prepared on the assumption that a double distance (twice as large as a distance from the center 21C of the spin base 21 to each of the projections 311, 321, and 331) is 300.5 mm, 300.2 mm, 300.1 mm, 300 mm, 299.9 mm, 299.8 mm, and 299.5 mm. FIG. 7 shows the plan view with the distance set at 300.5 mm (see a section (a) of FIG. 7) and the plan view with the distance set at 300.2 mm (see a section (b) of FIG. 7). The illustrations of the other plan views are omitted. On the basis of these plan views, a stroke of the abutting member 31 and a stroke of the abutting members 32 and 33 are determined that are necessary for reducing the distance stepwise from 300.5 mm. Result of the calculation is summarized in FIG. 8. For reference, FIG. 8 further shows a graph showing variation in the stroke of the abutting members 32 and 33 determined in the first embodiment.

FIG. 8 is a graph showing how a stroke is changed in response to change in a distance from the base center to the projection according to the third embodiment. As clearly seen from the graph, in order to reduce distances from the center 21C of the spin base 21 to the projections 311, 321, and 331 (distances from the base center to the projections) while these distances are kept equally, strokes are required to be changed appropriately. It can be seen from the graph that a way in which each of these strokes is changed can be approximated using a linear function. In the third embodiment, this linear function is stored in advance in the storage 92. For implementation of the centering operation, the arithmetic processor 91 reads the linear function from the storage 92. Then, during implementation of the centering operation, the arithmetic processor 91 acquires a stroke on the basis of the read linear function and controls the single mover 35 and the multi-mover 36. By doing so, like in the first embodiment, it is possible to perform the centering operation favorably using the abutting members 31 to 33 while distances from the center 21C of the spin base 21 to the projections 311, 321, and 331 are kept equally. As a result, action and effect comparable to those of the first embodiment are fulfilled.

In the third embodiment, as each of the projections 311, 321, and 331 has a semi-circular disk shape, wear is less likely to occur than in the first embodiment where each of the projections 311, 321, and 331 has a sharply pointed shape. This achieves reduction in exchange frequency of the abutting members 31 to 33, allowing burden on an operator and running cost to be reduced.

Note that the invention is not limited to the above embodiments and various changes other than the aforementioned ones can be made without departing from the gist of the invention. For example, in the above-described embodiments, nipping the substrate S with the abutting members 31 to 33, namely, completion of the centering operation is detected on the basis of variation in a load torque. The detection may be made by another method. In an exemplary configuration, the single mover 35, 37, or 38 or the multi-mover 36 may be provided with a sensor such as a load cell or a strain gauge, and stress or strain may be detected by the sensor when the substrate S is nipped with the abutting members 31 to 33 to output a detection signal. In this case, the control unit 9 determines nipping the substrate S with the abutting members 31 to 33 on the basis of the detection signal from the sensor.

In the above-described third embodiment, the arithmetic processor 91 is configured to calculate the stroke on the basis of the linear function. Alternatively, the arithmetic processor 91 may be configured to summarize change in the stroke in a data table and to store the data table into the storage 92, instead of using the linear function.

While each of the projections 311, 321, and 331 is formed into a semi-circular disk shape in the above-described third embodiment, it may be formed into a tilted shape as viewed from the vertical direction. This configuration of forming each of the projections 311, 321, and 331 into a semi-circular disk shape or forming each of the projections 311, 321, and 331 into a tilted shape is applicable to the second embodiment.

In the above-described embodiments, the present invention is applied to the centering device provided to the substrate processing apparatus 10 that performs the bevel etching process. Meanwhile, the centering device according to the present invention is applicable to every type of centering device provided to a substrate processing apparatus that performs a process while rotating a substrate of a circular plate shape and to and every type of centering method.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

This invention can be applied to centering techniques of aligning the center of a substrate of a circular plate shape placed on an upper surface of a substrate support with the center of the substrate support, and substrate processing apparatuses in general for processing a substrate using the centering techniques.

What is claimed is:

1. A centering device configured to align a center of a substrate having a circular plate shape with a center of a substrate support, the centering device comprising:

a first abutting member;

a second abutting member;

a third abutting member;

a moving mechanism including one or more movers configured to move the first abutting member, the second abutting member, and the third abutting member; and a controller configured to control the moving mechanism to move the first abutting member, the second abutting member, and the third abutting member in a horizontal plane in a first horizontal direction, a second horizontal direction, and a third horizontal direction, respectively, wherein, before the controller begins moving the first to third abutting members, the first abutting member, the second abutting member, and the third abutting member are respectively positioned at a first reference position, a second reference position, and a third reference position that are located equal distances from the center of the substrate support, each of the equal distances being greater than a radius of the substrate, wherein the first horizontal direction aligns with a radial direction from the center of the substrate support through the first reference position, wherein the second reference position is located on an opposite side of the first reference position with respect to the center of the substrate support and deviates from a virtual line extending in the first horizontal direction from the center of the substrate support, wherein the third reference position is located on the opposite side of the first reference position with respect to the center of the substrate support and on the opposite side of the second reference position with respect to the virtual line, wherein the second horizontal direction is different from the radial direction extending from the center of the substrate support through the second reference position, wherein the third horizontal direction is different from the radial direction extending from the center of the substrate support through the third reference position, wherein the controller is configured to control the moving mechanism to:

move the first abutting member in the first horizontal direction from the first reference position toward the center of the substrate support by a first stroke, the second abutting member in the second horizontal direction from the second reference position toward the center of the substrate support by a second stroke, and the third abutting member in the third horizontal direction from the third reference position toward the center of the substrate support by a third stroke, the first stroke being different from the second and third strokes and the second and third strokes being equal to each other so that the equal distances from the center of the substrate support are maintained while the first, second, and third abutting members move toward the center of the substrate support;

repeat the movements of the first abutting member, the second abutting member, and the third abutting member while maintaining the equal distances from the center of the substrate support until the controller determines that the substrate placed on an upper surface of the substrate support is nipped by the first abutting member, the second abutting member, and the third abutting member, thereby causing the center of the substrate to align with the center of the substrate support upon nipping the substrate.

2. The centering device according to claim 1, wherein the second horizontal direction and the third horizontal direction are parallel to the virtual line.

3. The centering device according to claim 2, wherein the third reference position is line-symmetric to the second reference position with respect to the virtual line, and the second stroke and the third stroke have an equal value.

4. The centering device according to claim 3, wherein the moving mechanism includes a single mover configured to move the first abutting member in the first horizontal direction and a multi-mover configured to move the second abutting member and the third abutting member collectively in the second horizontal direction and the third horizontal direction respectively.

5. The centering device according to claim 4, wherein the single mover includes a motor configured to move the first abutting member, the multi-mover includes a motor configured to move the second abutting member and the third abutting member, and the controller is configured to determine that the substrate is nipped with the first abutting member, the second abutting member, and the third abutting member on the basis of variation in a load torque occurring at at least one of a plurality of the motors.

6. The centering device according to claim 1, wherein the moving mechanism includes a first single mover configured to move the first abutting member in the first horizontal direction, a second single mover configured to move the second abutting member in the second horizontal direction, and a third single mover configured to move the third abutting member in the third horizontal direction.

7. The centering device according to claim 6, wherein the first single mover includes a motor configured to move the first abutting member, the second single mover includes a motor configured to move the second abutting member, the third single mover includes a motor configured to move the third abutting member, and the controller is configured to determine that the substrate is nipped with the first abutting member, the second abutting member, and the third abutting member based on variation in a load torque occurring at at least one of a plurality of the motors.

8. The centering device according to claim 1, comprising:

a sensor configured to detect stress or strain occurring in the moving mechanism when the substrate is nipped with the first abutting member, the second abutting member, and the third abutting member and then output a detection signal, wherein the controller is configured to determine that the substrate is nipped with the first abutting member, the second abutting member, and the third abutting member based on the detection signal from the sensor.

9. A substrate processing apparatus comprising:

the substrate support having the upper surface on which the substrate is supported in a horizontal posture;

the centering device according to claim 1;

a suction pump configured to exhaust air from between the substrate positioned by the centering device and the substrate support so as to hold the substrate under suction on the substrate support;

a rotary driver configured to rotate the substrate support about the center of the substrate support while the substrate is held under suction on the substrate support; and a processing liquid supply mechanism including a nozzle that supplies a processing liquid to a peripheral edge part of the substrate while the substrate is rotated about the center of the substrate support integrally with the substrate support.

10. The centering device according to claim 1, wherein amounts of the second stroke and the third stroke are greater than an amount of the first stroke.

11. A centering method of aligning a center of a substrate having a circular plate shape with a center of a substrate support, the centering method comprising:

placing the substrate on an upper surface of the substrate support; and moving a first abutting member, a second abutting member, and a third abutting member in a horizontal plane in a first horizontal direction, a second horizontal direction, and a third horizontal direction, respectively, wherein before moving the first to third abutting members, the first abutting member, the second abutting member, and the third abutting member are respectively positioned at a first reference position, a second reference position, and a third reference position that are located equal distances from the center of the substrate support, each of the equal distances being greater than a radius of the substrate, wherein the first horizontal direction aligns with a radial direction from the center of the substrate support through the first reference position, wherein the second reference position is located on an opposite side of the first reference position with respect to the center of the substrate support and deviates from a virtual line extending in the first horizontal direction from the center of the substrate support, wherein the third reference position is located on the opposite side of the first reference position with respect to the center of the substrate support and on the opposite side of the second reference position with respect to the virtual line, wherein the second horizontal direction is different from the radial direction extending from the center of the substrate support through the second reference position, wherein the third horizontal direction is different from the radial direction extending from the center of the substrate support through the third reference position, wherein the centering method further comprises:

moving the first abutting member in the first horizontal direction from the first reference position toward the center of the substrate support by a first stroke, the second abutting member in the second horizontal direction from the second reference position toward the center of the substrate support by a second stroke, and the third abutting member in the third horizontal direction from the third reference position toward the center of the substrate support by a third stroke, the first stroke being different from the second and third strokes and the second and third strokes being equal to each other so that the equal distances from the center of the substrate support are maintained while the first, second, and third abutting members move toward the center of the substrate support; and repeat the movements of the first abutting member, the second abutting member, and the third abutting member while maintaining the equal distances from the center of the substrate support until the substrate placed on an upper surface of the substrate support is determined as nipped by the first abutting member, the second abutting member, and the third abutting member, thereby causing the center of the substrate to align with the center of the substrate support upon nipping the substrate.

12. The centering method according to claim 11, wherein amounts of the second stroke and the third stroke are greater than an amount of the first stroke.

\* \* \* \* \*